United States Patent
Paul

(10) Patent No.: US 10,114,094 B2
(45) Date of Patent: Oct. 30, 2018

(54) METHOD AND MAGNETIC RESONANCE SYSTEM FOR DETECTING MR DATA

(71) Applicant: Siemens Aktiengesellschaft, Munich (DE)

(72) Inventor: Dominik Paul, Bubenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 741 days.

(21) Appl. No.: 14/812,131

(22) Filed: Jul. 29, 2015

(65) Prior Publication Data

US 2016/0033603 A1    Feb. 4, 2016

(30) Foreign Application Priority Data

Jul. 29, 2014    (DE) .................. 10 2014 214 844

(51) Int. Cl.
*G01R 33/48*    (2006.01)
*G01R 33/483*    (2006.01)
*G01R 33/561*    (2006.01)
*G01R 33/565*    (2006.01)

(52) U.S. Cl.
CPC ....... *G01R 33/4818* (2013.01); *G01R 33/482* (2013.01); *G01R 33/4833* (2013.01); *G01R 33/5617* (2013.01); *G01R 33/56563* (2013.01)

(58) Field of Classification Search
CPC .. G01R 33/561; G01R 33/34; G01R 33/4818; G01R 33/565; G01R 33/482; G01R 33/5617; G01R 33/56536; G01R 33/56563; A61B 5/055
See application file for complete search history.

(56) References Cited

U.S. PATENT DOCUMENTS

| | | | |
|---|---|---|---|
| 5,742,163 A | 4/1998 | Liu et al. | |
| 2010/0033179 A1 | 2/2010 | Hargreaves et al. | |
| 2011/0025325 A1* | 2/2011 | Li ..................... | G01R 33/4824 324/307 |
| 2011/0028829 A1 | 2/2011 | Hu et al. | |
| 2012/0126813 A1* | 5/2012 | Paul ..................... | A61B 5/055 324/309 |
| 2013/0033262 A1* | 2/2013 | Porter ................... | A61B 5/055 324/309 |
| 2013/0034287 A1 | 2/2013 | Itagaki et al. | |
| 2013/0099785 A1* | 4/2013 | Li ..................... | G01R 33/4833 324/309 |
| 2013/0335082 A1* | 12/2013 | Paul ................... | G01R 33/5615 324/309 |
| 2014/0225612 A1* | 8/2014 | Polimeni ............ | G01R 33/4835 324/309 |

OTHER PUBLICATIONS

Lu et al., "SEMAC: Slice Encoding for Metal Artifact Correction in MRI", Magnetic Resonance in Medicine vol. 62, pp. 66-76 (2009).

* cited by examiner

*Primary Examiner* — Tung X Nguyen
*Assistant Examiner* — David Frederiksen
(74) *Attorney, Agent, or Firm* — Schiff Hardin LLP

(57) ABSTRACT

In a method and apparatus for detecting magnetic resonance (MR) data a slice is slice-selectively excited followed by irradiation of a refocusing pulse and activation of first and second phase encoding gradients, and a readout gradient, in order to read out MR data that are entered into a line of k-space. MR data for further multiple lines of k-space are acquired without the first phase encoding gradient being activated again, and follow radiation of another refocusing pulse.

9 Claims, 5 Drawing Sheets

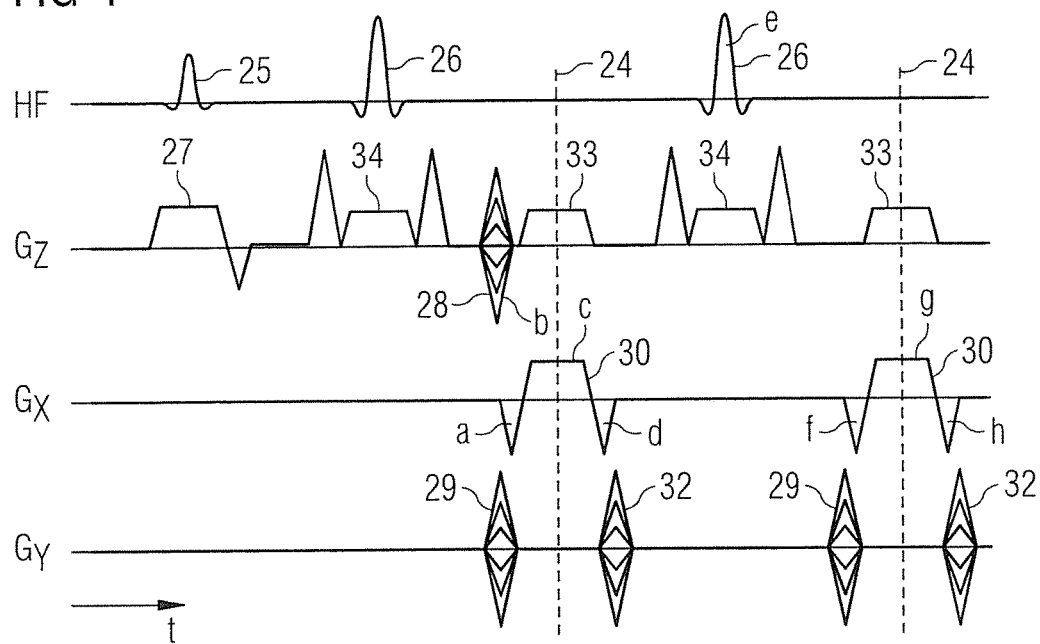
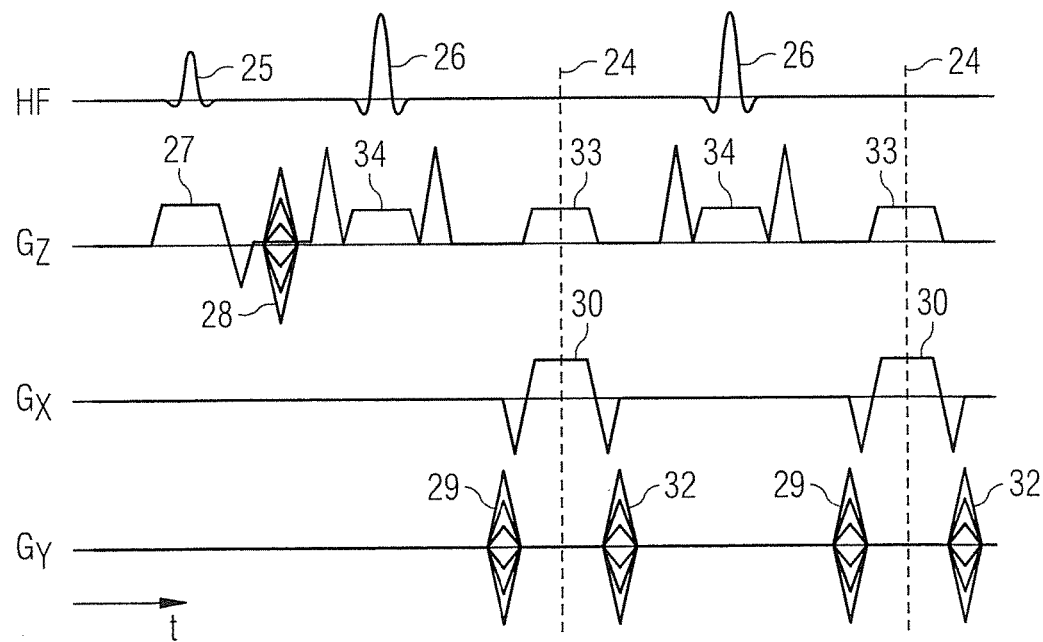

METHOD AND MAGNETIC RESONANCE SYSTEM FOR DETECTING MR DATA

BACKGROUND OF THE INVENTION

Field of the Invention

The present invention concerns a method and a magnetic resonance system to detect MR data of a predetermined volume portion of an object under examination, particularly in the case of magnetic field inhomogeneities.

Description of the Prior Art

A SEMAC method can be used to suppress metal artifacts in SE (spin echo)-based magnetic resonance data acquisition sequences (for example TSE (turbo spin echo)), see "SEMAC: Slice Encoding for Metal Artifact Correction in MRI", W. Lu et al. Magnetic Resonance In Medicine 62, pages 66-76, 2009. In this context, with a conventional two-dimensional protocol or slice-by-slice excitation, additional encoding is performed in the slice direction. This encoding corresponds to phase encoding and is also known as so-called SEMAC encoding. In this context, the measuring time increases linearly with the number of additional phase encoding steps in the slice-selection direction, which are also known as SEMAC steps. In particular in the case of T2-weighted TSE protocols with a long repetition time TR, this increases this entire measuring time markedly.

For example, a measuring duration of 2 minutes and 8 seconds is required to detect a slice with 256 phase encoding steps with a TSE sequence with a turbo factor of 8 and repetition time TR of 4 seconds. If eight SEMAC steps are used to suppress metal artifacts, the measuring time increases to more than 17 minutes, which is clearly too long for clinical protocols.

This long measuring time places significant stress on the gradient system of the magnetic resonance system, which can disadvantageously result in a limit defined, for example, by the duty cycle (for example defined by a percentage with which the first phase encoding gradient is switched over time) being exceeded.

SUMMARY OF THE INVENTION

An object of the present invention is to reduce the problems caused by the extreme stress.

The present invention provides a method for detecting MR data of a predetermined volume portion of an object under examination by operation of a magnetic resonance system. The method includes the following steps.

A slice-selection gradient is activated along a first direction or slice-selection direction.

An RF excitation pulse for selective excitation of the slice is radiated while the slice-selection gradient is activated, so that only nuclear spins of the slice are excited.

A refocusing pulse is radiated. In this context, particularly during radiation of the refocusing pulse, a second slice-selection gradient is activated along the first direction in order to refocus only the nuclear spins of the slice.

A first phase encoding gradient is activated along the first direction. The activation of this first phase encoding gradient can also be termed SEMAC encoding, so that the first phase encoding gradient is used for SEMAC encoding.

A second phase encoding gradient is activated along a second direction, which is perpendicular to the first direction.

Multiple k-space lines are scanned (filled with required (raw) MR data) by performing following substeps are performed multiple times, without the first phase encoding gradient along the first direction being activated again.

The substeps are activation of a readout gradient along a third direction, which is perpendicular to the first and the second directions, read out of the MR data while the readout gradient is activated, with the MR data for entry into a k-space line being read out, and radiation of the refocusing pulse while the second slice-selection gradient is activated. This substep is executed only if subsequently a new k-space line is read out without the RF excitation pulse being radiated again. In other words, this substep is executed only if subsequently the substeps of activating a readout gradient and reading out the MR data are performed without radiation of an RF excitation pulse being executed previously.

Consequently, the same RF excitation pulse is used to excite nuclear spins so as to emit MR data for entry into multiple k-space lines, with the first phase encoding gradient being activated only before the detection (entry of MR data into, or filling) of the first k-space line. Because according to the prior art, the first phase encoding gradient (for SEMAC encoding) is activated both before and after the detection of each k-space line, the long measuring time places significantly stress on the gradient system, which can result, for example, in extreme heat development and/or to the limit defined by the duty cycle being exceeded, which can then result in a shutdown of the magnetic resonance system. Because the present invention activates the first phase encoding gradient less frequently than the case in prior art, the above-described problems advantageously occur less frequently.

The following variants with respect to the second phase encoding gradient are within the scope of the invention.

According to a first variant, the above-described substeps for the detection of the multiple k-space lines are performed without the second phase encoding gradient being activated again along the second direction. In other words, according to this first variant, the second phase encoding gradient is also only activated once before the detection of the MR data of the multiple k-space lines.

According to a second variant, the above-described substeps for the detection of the multiple k-space lines are performed with the second phase encoding gradient in each case being activated along the second direction before the respective switching activation the readout gradient, and hence before the detection of the MR data of the respective k-space line of the multiple k-space lines. In other words, with the second variant, compared to the prior art, activation of the second phase encoding gradient after the respective detection of one of the multiple k-space lines is less frequent, which almost cancels the effect of the respective k-space line before the detection of those lines by the activation of the second phase encoding gradient.

According to a third variant, the above-described substeps for the detection of the multiple k-space lines are performed with the second phase encoding gradient in each case being activated along the second direction both before and after the respective activation of the readout gradient, and hence before and after the detection of the MR data of the respective k-space line of the multiple k-space lines. In other words, the third variant is no different from the prior art with respect to the second phase encoding gradient.

With the third variant, the second phase encoding gradient can be set such that in each case two chronologically successively detected k-space lines belong to the same slice, which is perpendicular to the second direction. In this context, these two chronologically successively detected k-space lines have the same distance to a plane, which extends through the center of the k-space perpendicular to the first direction and almost divides the slice perpendicular to the second direction into two equal halves. For example, the second phase encoding gradient can be set such that the (2n−1)th and the 2nth k-space line in each case lie in the same slice perpendicular to the second direction. In this context, the specified sequence corresponds to a sequence, in which the k-space lines are scanned chronologically during the processing of the above-described substeps and 2n corresponds to the number of the multiple k-space lines scanned during the processing of these substeps before the first phase encoding gradient is activated again.

With respect to the chronological position of the first phase encoding gradient, there are two variants, which can be combined with the above-described variants with respect to the second phase encoding gradient.

According to the first variant, the first phase encoding gradient is switched chronologically before the first refocusing pulse. In this context, that refocusing pulse which is irradiated before the performance of the above-described substeps, which are processed before the first phase encoding gradient is switched again, is deemed to be the first refocusing pulse in each case. In other words, on the reading out of the chronologically first detected k-space line of the plurality of k-space lines, which are detected on the performance of the above-described substeps before the first phase encoding gradient is switched again, an echo initiated by this first refocusing pulse is detected.

According to the second variant, the first phase encoding gradient is activated chronologically after the first refocusing pulse.

In order to achieve the same encoding effect, with the first variant, the first phase encoding gradient has an opposite polarity to that of the second variant inverse since, with the first variant, the first phase encoding gradient is activated before and, with the second variant, after, the first refocusing pulse is activated thus causing the direction of rotation of the spins with the first variant to be precisely opposite to the direction of rotation of the spins with the second variant.

Because the relatively long first phase encoding gradient, which is used for SEMAC encoding, is no longer activated in the echo train (i.e. no longer during the processing of the above-described substeps), the other gradients (in particular the second phase encoding gradient) move closer together chronologically as a result of which the so-called ESP (echo spacing, i.e. the distance between two chronologically adjacent echoes) can be reduced, thus resulting in improved image quality and a reduction in the recording time.

The present invention also provides a magnetic resonance system for the detection of MR data of a volume within an object under examination. The magnetic resonance system has a basic field magnet, a gradient field system, one or more RF antennas, and a control computer to control the gradient field system and the RF antenna(s), to receive the measuring signals picked up by the RF antenna(s) and to evaluate the measuring signals and compile the MR data in a data file. The magnetic resonance system is designed such that, with the gradient field system, the magnetic resonance system activates a slice-selection gradient along a first direction and, with the one or more RF antennas, radiates an RF excitation pulse for selective excitation of a slice, to which the slice-selection gradient is perpendicular. The magnetic resonance system is further designed to radiate a refocusing pulse with the at least one RF antenna, while the gradient field system activates a second slice-selection gradient along the first direction. In addition, the gradient field system is operated to activate a first phase encoding gradient along the first direction and a second phase encoding gradient along a second direction, which is perpendicular to the first direction. For the detection of multiple k-space lines, the magnetic resonance system is operated by the control computer to perform the following steps multiple times, without activating the first phase encoding gradient along the first direction again. These steps include activating a readout gradient along a third direction, which is perpendicular to the first direction and the second direction, and while the readout gradient is switched, detecting the MR data of a k-space line with the RF antenna or antennas. Furthermore, only if a further k-space line is to be detected, without the RF excitation pulse being radiated again the refocusing pulse is radiated again with the at least one RF antenna.

The advantages of the magnetic resonance system according to the invention substantially correspond to the advantages of the method according to the invention described above.

The present invention also encompasses a non-transitory, computer-readable data storage medium, which can be loaded into a memory of a programmable control computer of a magnetic resonance system. The programming instructions cause the computer to execute one or more of the above-described embodiments of the method according to the invention. In this context, the programming instructions may possibly require programming means, for example libraries and auxiliary functions, to implement the corresponding embodiments of the method. The programming instructions can be a source code (for example C++), which still has to be compiled and linked or only has to be interpreted or an executable software code which only needs to loaded into the computer or control device for execution.

The electronically readable data medium can be, for example a DVD, a magnetic tape, a hard disk or a USB stick on which electronically readable control information, in particular software, is stored.

Compared to the prior art, the present invention has lower gradient stress and hence fewer duty cycle problems and less heating and on the other hand permits chronological optimization of the recording procedure which has a positive effect on image quality.

The present invention is suitable for detecting MR data within a volume portion in which, or in the vicinity of which, a metallic implant is located. The present invention is not restricted to this preferred field of application since the present invention can be generally used with magnetic field inhomogeneities.

BRIEF DESCRIPTION OF THE DRAWINGS

FIGS. 3-5 show different variants of a sequence according to the invention for detecting MR data.

DESCRIPTION OF THE PREFERRED EMBODIMENTS

Figure 1:
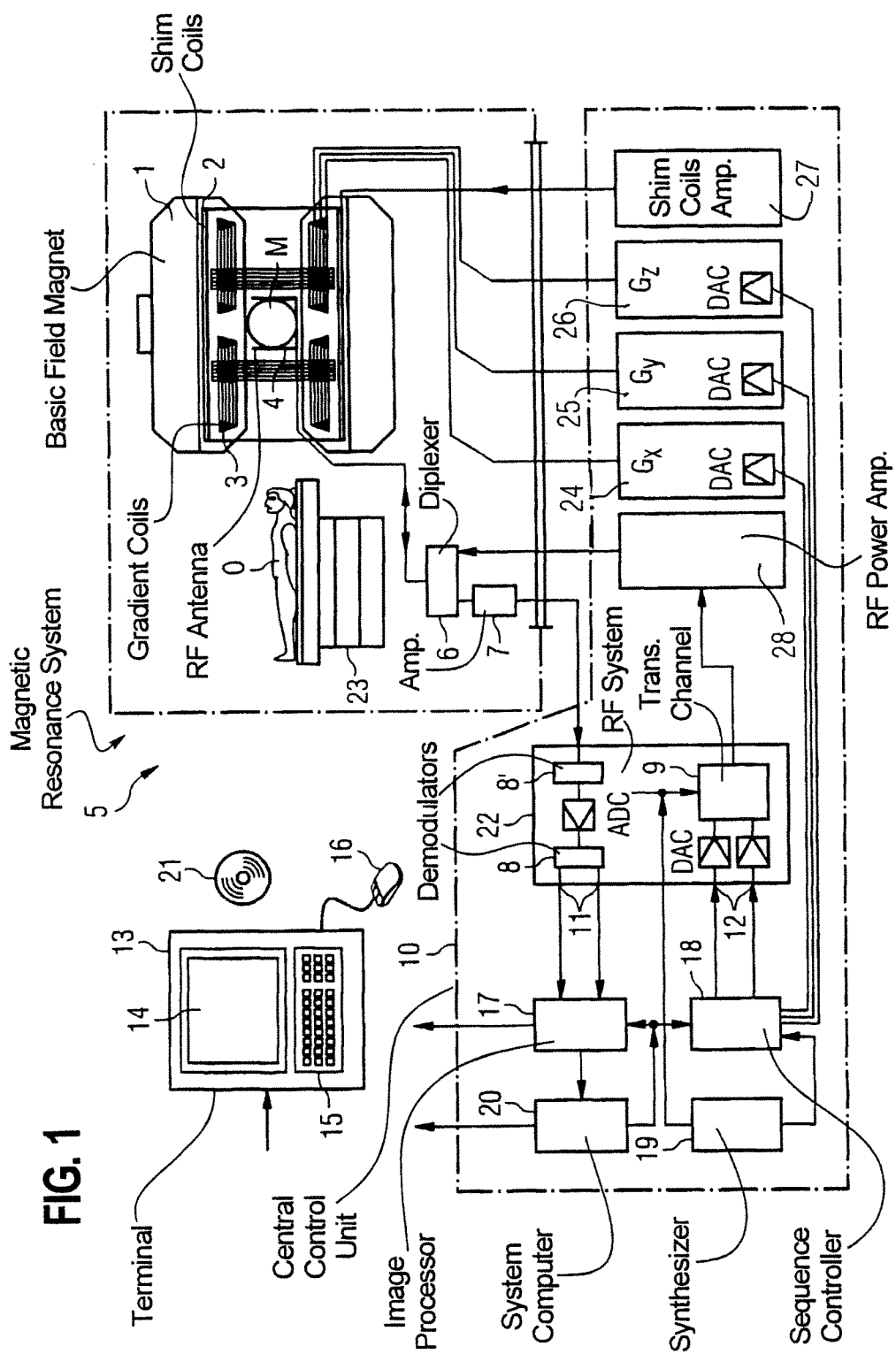
FIG. 1 depicts a magnetic resonance system according to the invention.

FIG. 1 is a schematic diagram of a magnetic resonance system according to the invention 5 (of a magnetic resonance imaging device or computed tomography device). In this context, a basic field magnet 1 of the scanner generates a chronologically constant strong magnetic field for the polarization or alignment of the nuclear spins in an area to be examined of an object O, such as, for example, a part of a human body to be examined. The object O, lying on a table 23, is continuously pushed into the magnetic resonance system 5. The high degree of homogeneity required for the nuclear spin resonance measurement of the basic magnetic field is defined in a typically spherical measuring volume M through which the parts of the human body to be examined are continuously moved. To support the requirements for homogeneity and in particular to eliminate chronologically invariable influences, so-called shim plates made of ferromagnetic material are attached at a suitable location. Chronologically variable influences are eliminated by shim coils 2, operated by a shim coils amplifier 27.

A cylindrical gradient field system or gradient field system 3 composed of three sub-windings is inserted in the basic field magnet 1. Each sub-winding is supplied by an amplifier with power for the generation of a linear (also chronologically variable) gradient field in the respective direction of the Cartesian coordinate system. In this context, the first sub-winding of the gradient field system 3 generates a gradient $G_x$ in the x-direction, the second sub-winding a gradient $G_y$ in the y-direction and the third sub-winding a gradient $G_z$ in the z-direction. Each amplifier includes a digital-analog converter, which is controlled by a sequence controller 18 for the generation of gradient pulses at the correct time.

Within the gradient field system 3, there is one (or more) radio-frequency antennas 4, which convert the radio-frequency pulses emitted by a radio-frequency power amplifier 28 into a magnetic alternating field for the excitation of the nuclei and alignment of the nuclear spins of the object O to be examined or the area to be examined of the object O. Each radio-frequency antenna 4 has one or more RF transmit coils and one or more of RF receive coils in the form of an annular, preferably linear or matrix-shaped arrangement of component coils. The RF receive coils of the respective radio-frequency antenna 4 also convert the alternating field emitted by the processing nuclear spins, i.e. as a rule, the nuclear-spin echo signals generated by a pulse sequence from one or more radio-frequency pulses and one or more gradient pulses, into a voltage (measuring signal) which is fed via an amplifier 7 to a radio-frequency receive channel 8 of a radio-frequency system 22. The radio-frequency system 22, which is part of a control device 10 of the magnetic resonance system 5, further has a transmit channel 9 in which the radio-frequency pulses for the excitation of the magnetic nuclear resonance generates. In this context, due to a pulse sequence specified by a system computer 20, the respective radio-frequency pulses are depicted digitally as a sequence of complex numbers in the sequence control 18. This sequence of numbers is fed as a real part and an imaginary part to respective inputs 12 of a digital-analog converter in the radio-frequency system 22, and from this to a transmit channel 9. In the transmit channel 9, the pulse sequences are modulated onto a radio-frequency carrier signal the base frequency of which corresponds to the resonance frequency of the nuclear spins in the measuring volume.

The switchover from transmit mode to receive mode takes place via a duplexer 6. The RF transmit coils of the radio-frequency antenna(s) 4 irradiate the radio-frequency pulses for the excitation of the nuclear spins or the refocusing pulses into the measuring volume M and the resulting echo signals are scanned via the RF receive coil(s). The correspondingly obtained nuclear resonance signals are phase-sensitively demodulated to an intermediate frequency in the receive channel 8' (first demodulator) of the radio-frequency system 22, and are digitized in the analog-digital converter (ADC), and emitted via the output 11. This signal is further demodulated to a frequency of 0. The demodulation to the frequency of 0 and the separation to a real part and an imaginary part take place after the digitization in the digital domain in a second demodulator 8. An MR image is reconstructed by an image computer 17 from the measurement data obtained in this way via an output 11. The administration of the measurement data, the image data and the control programs is performed by the system computer 20. Based on a specification with control programs, the sequence control 18 monitors the generation of the respective desired pulse sequences and the corresponding scanning of k-space. In particular, in this context, the sequence control 18 controls the accurately timed switching of the gradients, the emission of the radio-frequency pulses with a defined phase amplitude and the reception of the nuclear resonance signals. In this context, the sequence control 18 of the magnetic resonance system according to the invention switches a first phase encoding gradient 28 (see FIGS. 3-5) only once in order to detect a plurality of k-space lines. The time base for the radio-frequency system 22 and the sequence control 18 is provided by a synthesizer 19. The selection of corresponding control programs for the generation of an MR image, which are, for example, stored on a DVD 21 and the depiction of the MR image generated takes place via a terminal 13 comprising a keyboard 15, a mouse 16 and a screen 14.

Figure 2:
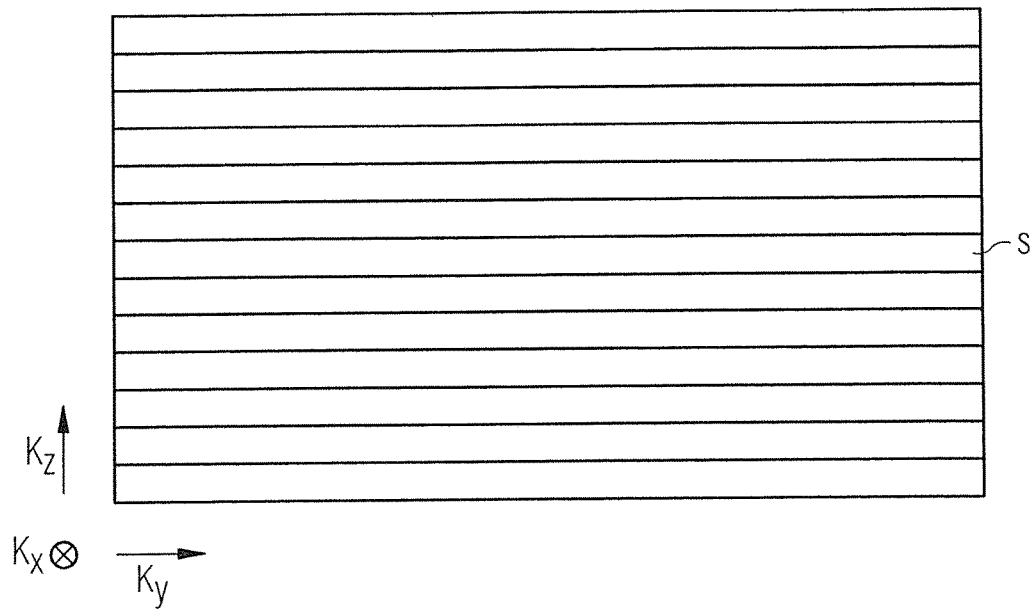
FIG. 2 depicts the detection of a k-space according to the SEMAC method.

FIG. 2 depicts the scanning of k-space according to the SEMAC method.

The object is to detect as many nuclear spins as possible that are excited by selective excitation of the slice s. Due to magnetic field inhomogeneities, the spins excited by the selective excitation are in a volume portion, which is at least partially distorted and displaced compared to the slice s. For this reason, according to the SEMAC method, slices in k-space in the direction $K_z$ adjacent to the slice s are also scanned or resolved with respect to location, as shown in FIG. 2.

Each slice depicted in FIG. 2 corresponds to a specific phase encoding step in the slice-selection direction $K_z$, i.e. a specific gradient moment of a first phase encoding gradient acting in the $K_z$ direction. A specific number of phase encoding steps along a second direction $K_y$ are required for the detection of the MR data of a slice. For each of these phase encoding steps, a k-space line is read out in a third direction $K_x$. In this context, the first direction $K_z$ or slice-selection direction, the second direction $K_y$ and the third direction $K_x$ are perpendicular to each another.

Figure 3:
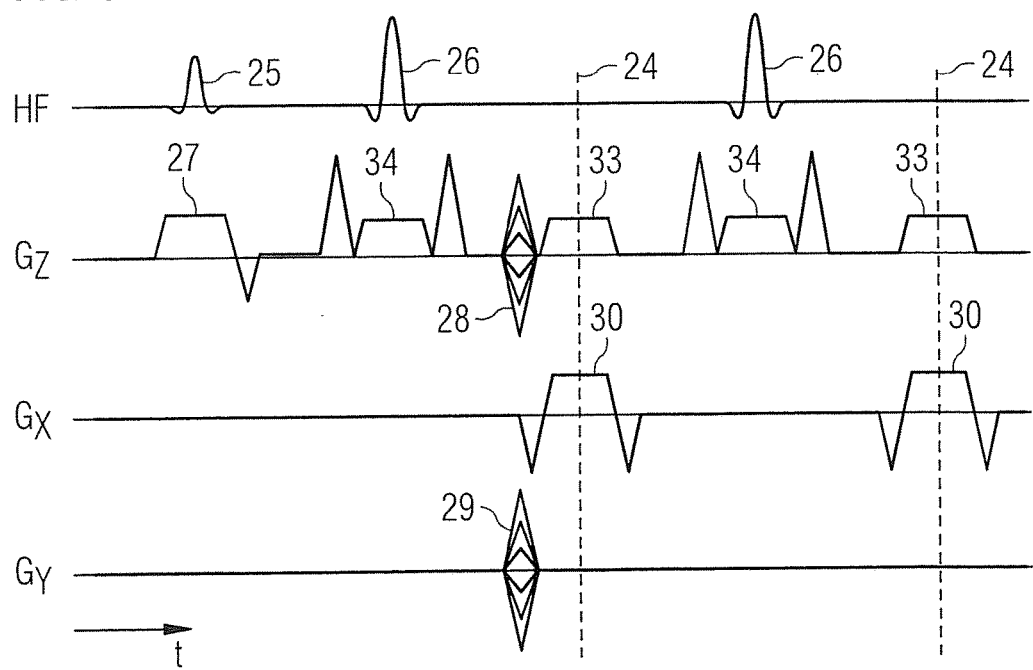

In FIG. 3 depicts a spin-echo sequence according to the invention for scanning (entering raw data into) k-space. The slice s is excited by an RF excitation pulse 25 while a slice-selection gradient 27 is activated in the slice-selection direction $K_z$. Subsequently, a refocusing pulse 26 is activated, while a further slice-selection gradient 34 is activated in the slice-selection direction $K_z$ so that only the spins in the slice s are refocused. This is followed by a phase encoding with the first phase encoding gradient 28 in the slice-selection direction and the second phase encoding gradient 29 along a second direction $K_y$ perpendicular to the slice-selection direction $K_z$. The activation of a readout gradient 30 in a third direction $K_x$ perpendicular to the slice-selection direction $K_z$ and perpendicular to the second direction $K_y$ causes the MR data of a k-space line to be detected. The gradient 33 activated during the read out of the MR data is used for VAT compensation as described in the aforementioned SEMAC publication. The spin echo 24 occurs in the middle of the read out of the k-space line.

It is conventional according to the prior art, to activate the first phase encoding gradient 28 and the second phase encoding gradient 29 again directly after the reading out the k-space line, in order to "cancel" the effect of the first and second phase encoding gradients 28, 29 activated before the read out of the k-space line. The sequence according to the invention shown in FIG. 3 departs from the conventional approach, because neither the first phase encoding gradient 28 nor the second phase encoding gradient 29 is activated again in order to read out a further k-space line. Instead, a further refocusing pulse 26 is radiated while a slice-selection gradient 34 is applied. Subsequently, a further k-space line is read out with an activated readout gradient 30.

FIG. 4 depicts a further variant of a sequence according to the invention for detecting MR data. Unlike the variant depicted in FIG. 3 variant, in each case after the detection of a k-space line, the second phase encoding gradient 32 is activated before the radiation of the next refocusing pulse 26. In other words, the variant depicted in FIG. 4 differs from the prior art only by the first phase encoding gradient 28 being activated once in order to detect multiple k-space lines, while the second phase encoding gradient 29, 32 is activated with a similar frequency to that in the prior art.

FIG. 5 shows another variant according to the invention, of a sequence for detecting MR data. Unlike the variant shown in FIG. 4, the first phase encoding gradient 28 is activated before the first refocusing pulse 26, with which the first k-space line of the multiple k-space lines, which are detected without further activation of the first phase encoding gradient 28, is detected. In other words, according to the invention, multiple k-space lines are detected in that the phase encoding gradient 28 is activated precisely only once before the detection of the first of set or group of k-space lines. For each detection, of one of set or group of k-space lines, precisely one refocusing pulse 26 is activated. With the sequence according to the invention depicted in FIG. 5, the first phase encoding gradient 28 is activated before the first of the multiple refocusing pulses 26.

Since the radiation of a refocusing pulse 26 reverses the direction of rotation of the spins, in the sequence depicted in FIG. 4 the first phase encoding gradient 28 do indeed have the same amount as the first phase encoding gradient 28 with the sequence depicted in FIG. 5, when both first phase encoding gradients are to result in the same SEMAC encoding. As a result of the reversal of the direction of rotation due to the irradiation of a refocusing pulse 26, the first phase encoding gradient 28 in the sequence depicted in FIG. 4 has a different plus/minus sign than the first phase encoding gradient 28 in the sequence depicted in FIG. 5.

In FIGS. 3 to 5, in each case only the detection of the first two echoes 24 or the first two k-space lines in the echo train of a turbo-spin echo sequence is depicted. As a rule, more than two echoes 24 are recorded with an echo train, wherein the pattern consisting of refocusing pulses 26 and gradients 28-34 is repeated correspondingly. According to the invention, the one-off encoding of the corresponding SEMAC step with the first phase encoding gradient 28 is used to acquire multiple phase encoding steps along the conventional or second direction $K_y$ with the same SEMAC encoding. In this context, this same SEMAC encoding in each case also comprises the SEMAC encoding reflected on the level, which extends through the center of the k-space perpendicular to the first direction $K_z$. In other words, in principle only six SEMAC encodings are required for the SEMAC encoding of the twelve slices above or below the slice s in FIG. 2 according to the invention. The respective switching of the refocusing pulse 26 so-to-speak results in jumping to and fro between the slice encoded directly by means of SEMAC encoding and the mirror-slice, which along the first direction $K_z$, has the same distance from the slice s in order in each case to scan a k-space line in the directly encoded slice and in the mirror-slice.

Figure 6:
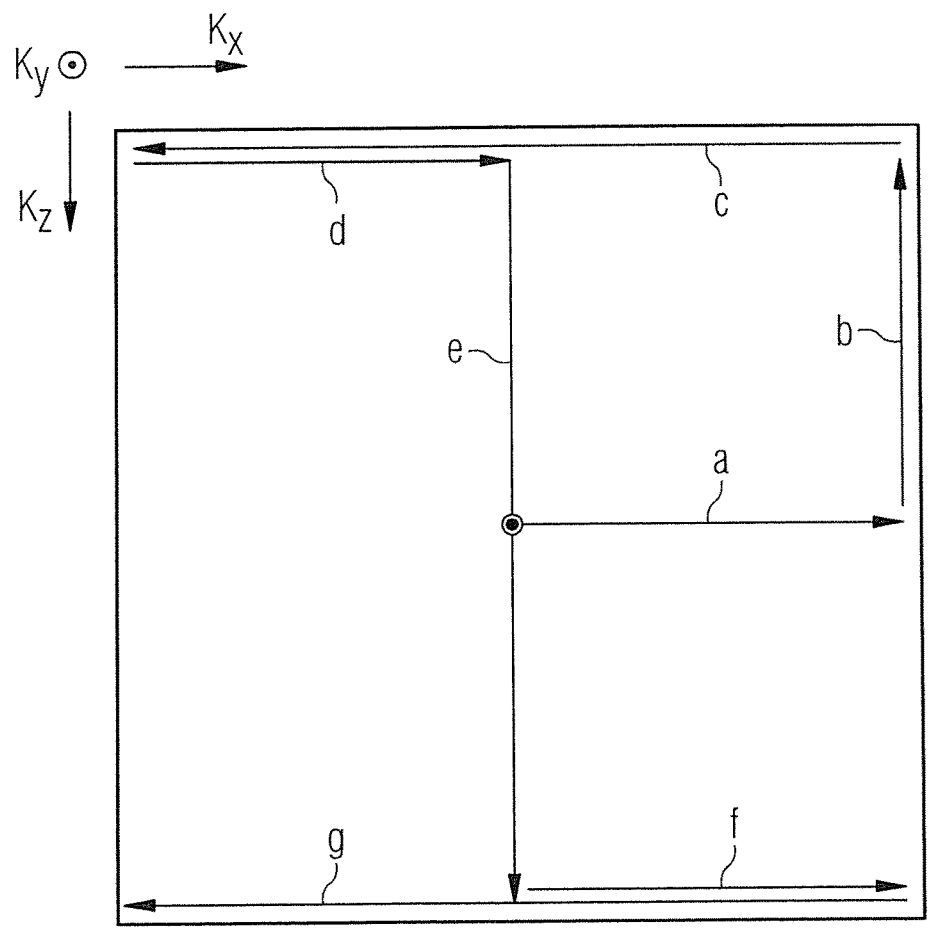
FIG. 6 is a schematic diagram of how the k-space is scanned according to the invention according to the sequence according to the invention depicted in FIG. 4.

FIG. 6 is a schematic diagram of how the sequence according to the invention in FIG. 4 can be used to navigate in the k-space. Switching the part of the readout gradient 30 designated with the reference character a and the first phase encoding gradient 28 or b is used to navigate at the start of chronologically first k-space line to be detected. This first k-space line is subsequently read out in that the part c of the readout gradient 30 is activated. Activating the last part d of the readout gradient 30 returns the navigation to the middle of the k-space line. Radiation of the refocusing pulse 26 or e results in navigation to the other side of the k-space along the first direction $K_z$. Radiation of the first part f of the next readout gradient 30 results in navigation at the start of the k-space line to be detected next chronologically, which is then read out in that the part g of the readout gradient 30 is activated.

The navigation in k-space depicted in FIG. 6 presupposes that, with the second phase encoding gradient 29, in each case the same slice is encoded perpendicular to the second direction $K_y$. If furthermore this same slice would be encoded perpendicular to the second direction, after the switching of the part h of the readout gradient 30 and further irradiation of a refocusing pulse 26 then as a third k-space line, the first k-space line would be detected again. To prevent this, it would hence be necessary either for the first phase encoding gradient 28 to be activated again with another value or for the second phase encoding gradient 29 to have a different value. Consequently, with the sequence according to the invention depicted in FIG. 3 only two k-space lines can be read out before either the first phase encoding gradient 28 or the second phase encoding gradient 29 have to be activated again in order to detect further k-space lines.

Figure 7:
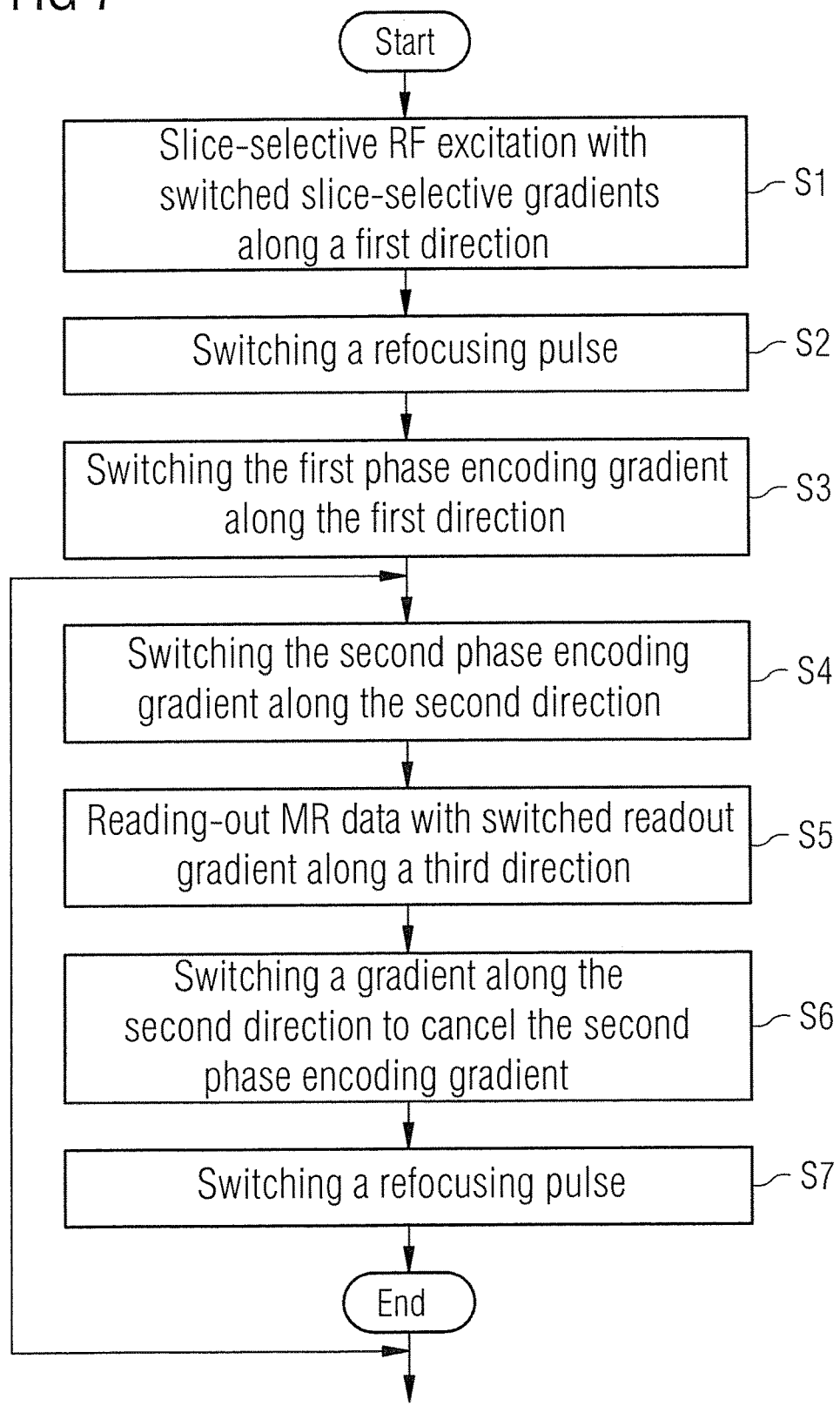
FIG. 7 is a flowchart of a method according to the invention.

FIG. 7 depicts the method according to the invention in the form of a flow diagram.

In the first step S1, a slice s of the predetermined volume portion is selectively excited in that, with a switched slice-selection gradient 27, the RF excitation pulse 25 is radiated. Subsequently, in the second step S2, a refocusing pulse 26 is irradiated. This is followed in step S3 by the activation of the first phase encoding gradient 28 along the first direction or slice-selection direction $K_z$. Subsequently, in the following (sub)steps S4-S7, which are performed many times, multiple k-space lines are detected without the first phase encoding gradient 28 being activated again.

In step S4, the second phase encoding gradient 29 is activated along the second direction. Subsequently, in step S5, the MR data are read out with an activated readout gradient 30. Before the refocusing pulse 26 is activated in step S7 in order to navigate to the other side of k-space (see FIG. 6), the second phase encoding gradient 32 can be activated in step S6 in order to cancel the effect of the first phase encoding gradient 29.

Following step S7, the method jumps recursively back to step S4 in order to perform steps S4-S7 once again. During the last pass of steps S4 to S7, step S7 is not performed when the data detection is subsequently fully completed or the RF excitation pulse 25 is irradiated again.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for acquiring magnetic resonance (MR) data from an object, comprising:

operating an MR scanner, while an object is situated therein, to activate a slice-selection gradient along a first direction and to radiate a radio-frequency (RF) excitation pulse that excites nuclear spins in a volume of the object selected by said slice-selection gradient;

operating said MR scanner to radiate a first refocusing pulse and to activate a first phase encoding gradient along said first direction and to activate a second phase encoding gradient along a second direction that is perpendicular to said first direction;

operating said MR scanner to activate a readout gradient along a third direction that is perpendicular to said first direction and to said second direction to read out MR data from the object;

entering the MR data into a memory organized as k-space, comprising a plurality of k-space lines, by entering said MR data into a first k-space line among said plurality of k-space lines; and for each of multiple k-space lines in said plurality of k-space lines other than said first k-space line, activating said readout gradient along said third direction, without again activating said first phase encoding gradient, and radiate a second refocusing pulse and, after radiating said second refocusing pulse, reading out further MR data and entering said further MR data respectively into said multiple k-space lines.

2. A method as claimed in claim 1 comprising acquiring said MR data for said multiple k-space lines without activating said second phase encoding gradient.

3. A method as claimed in claim 1 comprising acquiring said MR data for said multiple k-space lines by activating said second phase encoding gradient only before activating said readout gradient.

4. A method as claimed in claim 1 comprising acquiring said MR data for said multiple k-space lines by activating said second phase encoding gradient once before and once after activating said readout gradient.

5. A method as claimed in claim 4 comprising activating said second phase encoding gradient to cause MR data for two of said multiple k-space lines that are detected in chronological succession to belong to a same slice perpendicular to said second direction, and wherein said two of said multiple k-space lines have a same distance to a plane that proceeds through a center of k-space perpendicular to said first direction.

6. A method as claimed in claim 1 comprising, for detecting said MR data that are entered into said first line among said multiple lines of k-space, activating said first phase encoding gradient before radiating said first refocusing pulse, with said MR data that are entered into said first line among said multiple lines of k-space being detected based on an echo caused by said first refocusing pulse.

7. A method as claimed in claim 1 comprising, for detecting said MR data that are entered into said first line among said multiple lines of k-space, activating said first phase encoding gradient after radiating said first refocusing pulse, with said MR data that are entered into said first line among said multiple lines of k-space being detected based on an echo caused by said first refocusing pulse.

8. A magnetic resonance (MR) apparatus comprising:

an MR scanner comprising a gradient coil system and radio-frequency (RF) radiator;

an electronic memory;

a control computer configured to operate said MR scanner, while an object is situated therein, to activate a slice-selection gradient along a first direction and to radiate a radio-frequency (RF) excitation pulse that excites nuclear spins in a volume of the object selected by said slice-selection gradient;

said control computer being configured to operate said MR scanner to radiate a first refocusing pulse and to activate a first phase encoding gradient along said first direction and to activate a second phase encoding gradient along a second direction that is perpendicular to said first direction;

said control computer configured to operate said MR scanner to activate a readout gradient along a third direction that is perpendicular to said first direction and to said second direction to read out MR data from the object;

said control computer being configured to enter the MR data into said electronic memory organized as k-space, comprising a plurality of k-space lines, by entering said MR data into a first k-space line among said plurality of k-space lines; and said control computer configured for each of multiple k-space lines in said plurality of k-space lines other than said first k-space line, to activate said readout gradient along said third direction, without again activating said first phase encoding gradient, and to radiate a second refocusing pulse and, after radiating said second refocusing pulse, to read out further MR data and entering said further MR data respectively into said multiple k-space lines in said electronic memory.

9. A non-transitory, computer-readable data storage medium encoded with programming instructions, said storage medium being loaded into a control computer of a magnetic resonance (MR) apparatus that comprises an MR scanner, said programming instructions causing said control computer to:

operate said MR scanner, while an object is situated therein, to activate a slice-selection gradient along a first direction and to radiate a radio-frequency (RF) excitation pulse that excites nuclear spins in a volume of the object selected by said slice-selection gradient;

operate said MR scanner to radiate a first refocusing pulse and to activate a first phase encoding gradient along said first direction and to activate a second phase encoding gradient along a second direction that is perpendicular to said first direction;

operate said MR scanner to activate a readout gradient along a third direction that is perpendicular to said first direction and to said second direction to read out MR data from the object;

enter the MR data into a memory organized as k-space, comprising a plurality of k-space lines, by entering said MR data into a first k-space line among said plurality of k-space lines; and for each of multiple k-space lines in said plurality of k-space lines other than said first k-space line, activate said readout gradient along said third direction, without again activating said first phase encoding gradient, and radiate a second refocusing pulse and, after again radiating said second refocusing pulse, read out further MR data and enter said further MR data respectively into said multiple k-space lines.

\* \* \* \* \*